(12) United States Patent
Pei (10) Patent No.: US 10,256,333 B2
(45) Date of Patent: Apr. 9, 2019

(54) HIGH ELECTRON MOBILITY TRANSISTOR

(71) Applicant: Gpower Semiconductor, Inc., Suzhou (CN)

(72) Inventor: Yi Pei, Suzhou (CN)

(73) Assignee: GPOWER SEMICONDUCTOR, INC., Suzhou (CN)

( * ) Notice: Subject to any disclaimer, the term of this patent is extended or adjusted under 35 U.S.C. 154(b) by 26 days.

(21) Appl. No.: 15/462,319

(22) Filed: Mar. 17, 2017

(65) Prior Publication Data

US 2017/0194471 A1 Jul. 6, 2017

Related U.S. Application Data

(63) Continuation of application No. PCT/CN2015/072945, filed on Feb. 12, 2015.

(30) Foreign Application Priority Data

Sep. 19, 2014 (CN) .......................... 2014 1 0479659

(51) Int. Cl.
| | | |
|---|---|---|
| *H01L 29/15* | (2006.01) | |
| *H01L 29/778* | (2006.01) | |
| *H01L 29/06* | (2006.01) | |
| *H01L 29/47* | (2006.01) | |
| *H01L 29/66* | (2006.01) | |

(Continued)

(52) U.S. Cl.
CPC ...... *H01L 29/7786* (2013.01); *H01L 29/0607* (2013.01); *H01L 29/0611* (2013.01); *H01L 29/0657* (2013.01); *H01L 29/47* (2013.01); *H01L 29/66462* (2013.01); *H01L 29/2003* (2013.01); *H01L 29/404* (2013.01)

(58) Field of Classification Search
CPC ... H01L 29/0607; H01L 29/404; H01L 29/47; H01L 29/66462; H01L 29/7786
USPC .......................................................... 257/76
See application file for complete search history.

(56) References Cited

U.S. PATENT DOCUMENTS

| | | | | |
|---|---|---|---|---|
| 2005/0110042 A1* | 5/2005 | Saito | ..................... | H01L 29/402 257/192 |
| 2006/0145189 A1* | 7/2006 | Beach | ................... | H01L 29/405 257/192 |

(Continued)

FOREIGN PATENT DOCUMENTS

| | | | |
|---|---|---|---|
| CN | 1639875 A | * | 7/2005 |
| CN | 101107713 A | * | 1/2013 |

*Primary Examiner* — Long K Tran
(74) *Attorney, Agent, or Firm* — Flener IP & Business Law, LLC; Zareefa B. Flener (57) ABSTRACT

The embodiments of the present invention disclose a high electron mobility transistor, comprising: a substrate; a channel layer located on the substrate; a barrier layer located on the channel layer; a source electrode, a drain electrode, and a schottky gate electrode located between the source electrode and the drain electrode, all located on the barrier layer; and at least one semiconductor field ring located on the barrier layer and between the schottky gate electrode and the drain electrode. In the embodiments of the present invention, a concentration of two-dimensional electron gas at an interface between a barrier layer and a channel layer can be adjusted. Therefore, the concentration effect of the electric field at an edge of a gate is effectively improved, and the breakdown voltage of high electron mobility transistors is increased.

17 Claims, 5 Drawing Sheets

(51) Int. Cl.
   *H01L 29/40*    (2006.01)
   *H01L 29/20*    (2006.01)

(56) References Cited

U.S. PATENT DOCUMENTS

2007/0221932 A1* 9/2007 Kano .................... B82Y 20/00
                                                    257/96
2009/0085063 A1* 4/2009 Makiyama ........ H01L 29/66431
                                                    257/192
2013/0026450 A1* 1/2013 Park ................. H01L 29/41725
                                                    257/24
2013/0277680 A1* 10/2013 Green .................. H01L 29/402
                                                    257/76

* cited by examiner

HIGH ELECTRON MOBILITY TRANSISTOR

CROSS-REFERENCE TO RELATED APPLICATIONS

This application is a continuation of international application No. PCT/CN2015/072945 filed on Feb. 12, 2015, which claims the benefit and priority of Chinese patent application No. 201410479659.X filed on Sep. 19, 2014. Both applications are incorporated herein in their entirety by reference.

TECHNICAL FIELD

The disclosed embodiments relate to the technical field of semiconductors, and in particular to a high electron mobility transistor.

BACKGROUND

GaN-based high electron mobility transistors (HEMTs), due to a high concentration of two-dimensional electron gas (2DEG) and a high breakdown voltage, have attracted extensive attention from scientific research institutes and enterprises. It is one of the greatest challenges in the research of GaN-based HEMTs to make the breakdown voltage as high as possible while maintaining a low on-resistance.

GaN-based HEMT devices usually have planar structures. When the HEMT is in the OFF state, a negative bias is applied to the gate electrode, a positive bias is applied to the drain electrode, and the source electrode is grounded. This results in concentration of electric field lines at an edge of a side of the gate electrode close to the drain electrode, such that an electric field peak is formed. When the voltages applied to the gate electrode and to the drain electrode are gradually increased, the electric field peak at the edge of the gate electrode is further increased. The device will be broken down here when the applied voltage is higher than the critical breakdown electric field strength.

SUMMARY

Accordingly, the disclosed embodiments propose a high electron mobility transistor, for a purpose of increasing the breakdown voltage of the high electron mobility transistors.

Embodiments of the present invention provide a high electron mobility transistor, comprising: a substrate; a channel layer located on the substrate; a barrier layer located on the channel layer; a source electrode, a drain electrode, and a schottky gate electrode located between the source electrode and the drain electrode, all located on the barrier layer; and at least one semiconductor field ring located on the barrier layer and between the schottky gate electrode and the drain electrode.

In one embodiment, the at least one semiconductor field ring has a lattice constant greater than that of the barrier layer.

In one embodiment, the at least one semiconductor field ring has a homogeneous structure.

In one embodiment, the at least one semiconductor field ring contains a first metal element, and a content of the first metal element in the at least one semiconductor field ring decreases from an interface where the at least one semiconductor field ring contacts with the barrier layer to a side of the at least one semiconductor field ring away from the barrier layer.

In one embodiment, the at least one semiconductor field ring comprises a first layer close to the barrier layer and a second layer away from the barrier layer in a direction perpendicular to the barrier layer, and a content of a metal element in the first layer is greater than that of a metal element in the second layer.

In one embodiment, a distance of the at least one semiconductor field ring to the schottky gate electrode is less than that of the semiconductor field ring to the drain electrode.

In one embodiment, there are at least two semiconductor field rings.

In one embodiment, a distance of at least one semiconductor field ring in the at least two semiconductor limiting rings to the schottky gate electrode is less than that of the semiconductor field ring to the drain electrode.

In one embodiment, the at least two semiconductor field rings comprise a first semiconductor field ring close to the schottky gate electrode and a second semiconductor field ring close to the drain electrode, and a thickness of the first semiconductor field ring is greater than that of the second semiconductor field ring.

In one embodiment, one of the at least two semiconductor field rings close to the schottky gate electrode comprises at least two layers having different components in a direction perpendicular to the barrier layer, and the topmost layer of the at least two semiconductor field rings is gradually omitted in a direction from the schottky gate electrode to the drain electrode, so that a stepped structure in which a thickness of a plurality of semiconductor field rings is gradually decreased by one layer is formed.

In one embodiment, the barrier layer and the at least one semiconductor field ring are made of III-V compound semiconductor material.

In one embodiment, the channel layer is made of GaN, the barrier layer is made of AlGaN, and the at least one semiconductor field ring is made of any one of AlGaN, n-type GaN or p-type GaN.

In one embodiment, the channel layer is made of GaN, the barrier layer is made of InAlN, and the at least one semiconductor field ring is made of any one of InAlN, n-type GaN or p-type GaN.

In one embodiment, the at least one semiconductor field ring is made of AlGaN, and from an interface where the at least one semiconductor field ring contacts with the barrier layer to a side of the at least one semiconductor field ring away from the barrier layer, a content of Al element in the at least one semiconductor field ring gradually decreases, and a content of Ga element gradually increases.

In one embodiment, the at least one semiconductor field ring is made of InAlN, and from an interface where the at least one semiconductor field ring contacts with the barrier layer to a side of the at least one semiconductor field ring away from the barrier layer, a content of Al element in the at least one semiconductor field ring gradually decreases, and a content of In element gradually increases.

In one embodiment, both the barrier layer and the at least one semiconductor field ring are made of AlGaN, and a content of Al in the AlGaN barrier layer is greater than a maximum content of Al element in the at least one semiconductor field ring.

In one embodiment, both the barrier layer and the at least one semiconductor field ring are made of InAlN, and a content of Al element in the InAlN barrier layer is greater than a maximum content of Al element in the at least one semiconductor field ring.

In one embodiment, the high electron mobility transistor further comprises a passivation layer located on surfaces of the source electrode, the drain electrode, the schottky gate electrode, the at least one semiconductor field ring and the barrier layer.

In one embodiment, the passivation layer is made of any one of $SiN_x$, $SiO_2$, AlN and $Al_2O_3$ or combination thereof.

In the high electron mobility transistor according to the embodiments of the present invention, by forming a channel layer on a substrate, forming a barrier layer on the channel layer, forming a source electrode, a drain electrode, and a schottky gate electrode located between the source electrode and the drain electrode on the barrier layer, and forming at least one semiconductor field ring between the schottky gate electrode and the drain electrode on the barrier layer, a concentration of two-dimensional electron gas at an interface between the barrier layer and the channel layer can be adjusted. Therefore, the concentration effect of the electric field at an edge of a gate electrode is effectively improved, and the breakdown voltage of high electron mobility transistors is increased.

The additional features and advantages will be more readily appreciated by those skilled in the art from the following description of embodiments with reference to the accompanying drawings.

BRIEF DESCRIPTION OF DRAWINGS

Examples will now be explained with reference to the drawings. The drawings serve to illustrate the basic principle, so that only aspects necessary for understanding the basic principle are illustrated. The drawings are not to scale. In the drawings, the same reference characters denote like features.

DETAILED DESCRIPTION

Hereinafter, the technical solutions of the present invention will be further described with reference to the drawings and by specific implementations. Spatially relative terms such as "beneath", "below", "under", "low", "above", "on" and "high" are used for ease of description to explain the positioning of one element relative to a second element. These terms are intended to encompass different orientations of the device in addition to orientations other than those depicted in the figures. Additionally, for example, "one element is on/under another element" may mean that the two elements contact directly, or that there are other elements interposed between the two elements. In addition, terms such as "first" and "second" are also used to describe various elements, regions, sections, etc., and are not intended to be limiting. Like terms refer to like elements throughout the description.

The breakdown voltage of the HEMT devices can be increased by semiconductor field rings. For a Si PN junction or schottky junction, when the reverse voltage applied to the main junction is lower than the breakdown voltage, the space charge region of the main junction has been extended to the field ring junction. Then, punch-through occurs. After the occurrence of punch-through, the potential of the ring junction is increased. If the reverse voltage is further increased, the space charge region will be spread in the vicinity of the ring junction, and the increased voltage is borne by the ring junction. In this case, the ring junction functions as a voltage divider. Therefore, the breakdown voltage of semiconductor devices can be increased by the field ring technology.

Figure 1:
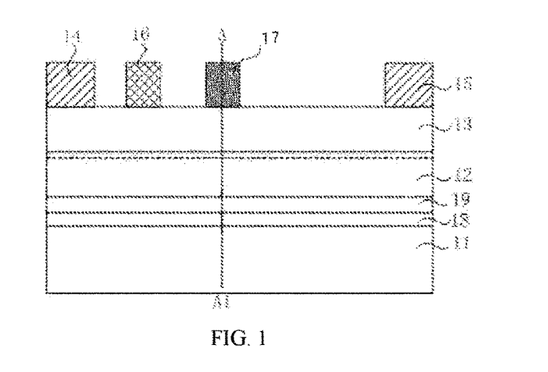
FIG. 1 is a structure diagram of a high electron mobility transistor according to a first embodiment of the present invention.
Figure 2:
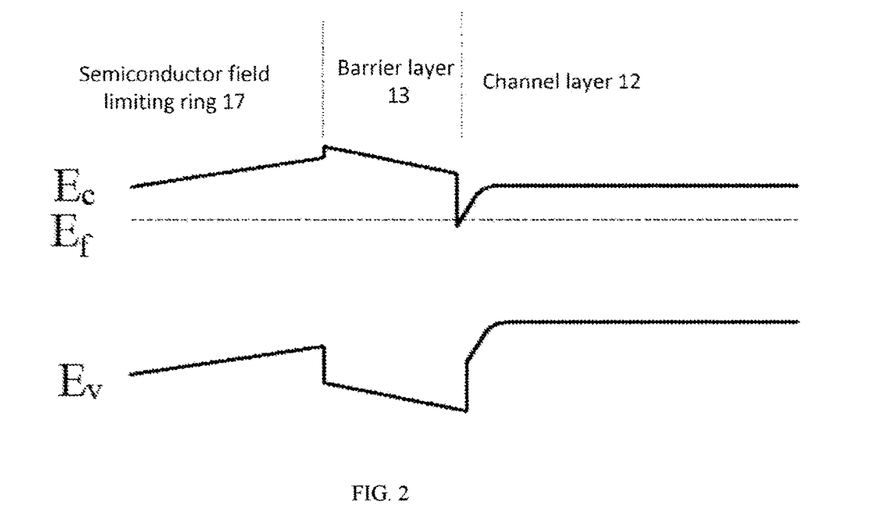
FIG. 2 is an energy band diagram of the high electron mobility transistor according to the first embodiment of the present invention in a direction A-A1 of FIG. 1.

FIG. 1 is a structure diagram of a high electron mobility transistor according to a first embodiment of the present invention, and FIG. 2 is an energy band diagram of the high electron mobility transistor according to the first embodiment of the present invention in a direction A-A1 of FIG. 1. The first embodiment of the present invention will now be described with reference to FIG. 1 and FIG. 2.

Referring to FIG. 1, the high electron mobility transistor comprises: a substrate 11; a channel layer 12 located on the substrate 11; a barrier layer 13 located on the channel layer 12; a source electrode 14, a drain electrode 15, and a schottky gate electrode 16 located between the source electrode 14 and the drain electrode 15, all located on the barrier layer 13; and at least one semiconductor field ring 17 located on the barrier layer 13 and between the schottky gate electrode 16 and the drain electrode 15.

In this embodiment, the substrate 11 may be made of GaN, Si, sapphire, SiC, AlN or other semiconductor materials.

The channel layer 12 located on the substrate 11 may be made of GaN, and the barrier layer 13 located on the channel layer 12 may be made of AlGaN. The channel layer 12 and the barrier layer 13 form a heterojunction structure, with 2DEG (as indicated by the dotted line in FIG. 1) being formed at the heterogeneous interface. The source electrode 14 and the drain electrode 15 form Ohm contact with the barrier layer 13, respectively.

The source electrode 14 and the drain electrode 15 each are preferably a single layer of metal or a stack of a plurality of layers of metal. Here, the metal is preferably any one or more of Ti, Al, Ni, Au or Mo.

The schottky gate electrode 16 is preferably a single layer of metal or a stack of a plurality of layers of metal. Wherein, the metal is preferably any one or more of Ni, Pt or Au.

The semiconductor field ring 17 is located on the barrier layer 13 and between the schottky gate electrode 16 and the drain electrode 15. For example, the semiconductor field ring 17 is homogeneous. The barrier layer 13 and the semiconductor field ring 17 are made of III-V compound semiconductor material. Preferably, when the barrier layer 13 is made of AlGaN, the semiconductor field ring 17 is also made of AlGaN. For example, a content of Al element in the AlGaN barrier layer 13 is greater than that of Al element in the AlGaN semiconductor field ring 17. Because a lattice constant of AlN material is less than that of GaN material and the content of Al element in the AlGaN semiconductor field ring 17 is less than the content of Al in the AlGaN barrier layer 13, the AlGaN semiconductor field ring 17 has a lattice constant greater than that of the AlGaN barrier layer 13 located below the AlGaN semiconductor field ring 17. In this way, a strain is introduced to an interface where the AlGaN semiconductor field ring 17 contacts with the AlGaN barrier layer 13, and a compressive stress is applied to the AlGaN semiconductor field ring 17. Since there is a piezoelectric effect between the AlGaN semiconductor field ring 17 and the AlGaN barrier layer 13, piezoelectric negative charges are introduced into the interface where the AlGaN semiconductor field ring 17 contacts with the AlGaN barrier layer 13, and the piezoelectric negative charges may deplete the 2DEG below the AlGaN semiconductor field ring 17.

Meanwhile, due to the pinning effect of the surface state of the AlGaN semiconductor field ring 17, the Fermi level is pinned below the surface conduction band of the AlGaN semiconductor field ring 17. By the combined effect of the electric field generated by the piezoelectric negative charges and the Fermi level pinning, the conduction band at the AlGaN barrier layer 13 and the GaN channel layer 12 moves upward (referring to FIG. 2 which is an energy band diagram of the high electron mobility transistor according to the first embodiment of the present invention in a direction A-A1 of FIG. 1), so that the concentration of 2DEG at the AlGaN barrier layer 13 and the GaN channel layer 12 below the AlGaN semiconductor field ring 17 is decreased and a part of the 2DEG is depleted. The electric field strength at the edge of the gate electrode is decreased, and the voltage withstanding level of the HEMT device is improved.

In this embodiment of the present invention, if no AlGaN semiconductor field ring 17 is provided on the HEMT device, when the HEMT device is in the OFF state, a negative bias is applied to the schottky gate electrode 16, a positive bias is applied to the drain electrode 15, and the 2DEG below the schottky gate electrode 16 is depleted. Then, the density of electric field lines at an edge of a side of the schottky gate electrode 16 close to the drain electrode 15 is sharply increased, and the current leakage of the schottky junction also increases rapidly. Consequently, the HEMT device is broken down. When an AlGaN semiconductor field ring 17 is provided, it can be seen from FIG. 1 that only part of the 2DEG at the heterojunction interface formed by the corresponding AlGaN barrier layer 13 and GaN channel layer 12 below the AlGaN semiconductor field ring 17 is depleted. Therefore, in this case, the electric field lines are re-distributed along the depletion region. Some of the electric field lines are directed to the depletion region below the AlGaN semiconductor field ring 17. In this way, the density of the electric field lines at the edge of the side of the schottky gate electrode 16 close to the drain electrode 15 is decreased, and the electric field peak is decreased. Thus, the reverse leakage current of the schottky junction of the gate electrode is inhibited, and the breakdown voltage is increased.

Continuously referring to FIG. 1 and FIG. 2, in one embodiment of the present invention, one semiconductor field ring 17 is provided for the schottky gate electrode 16 and the drain electrode 15 and the semiconductor field ring 17 is arranged close to the gate electrode 16, so that the electric field peak generated in the vicinity of the gate electrode 16 is decreased more effectively, and the breakdown voltage of the HEMT device is further increased.

Figure 3:
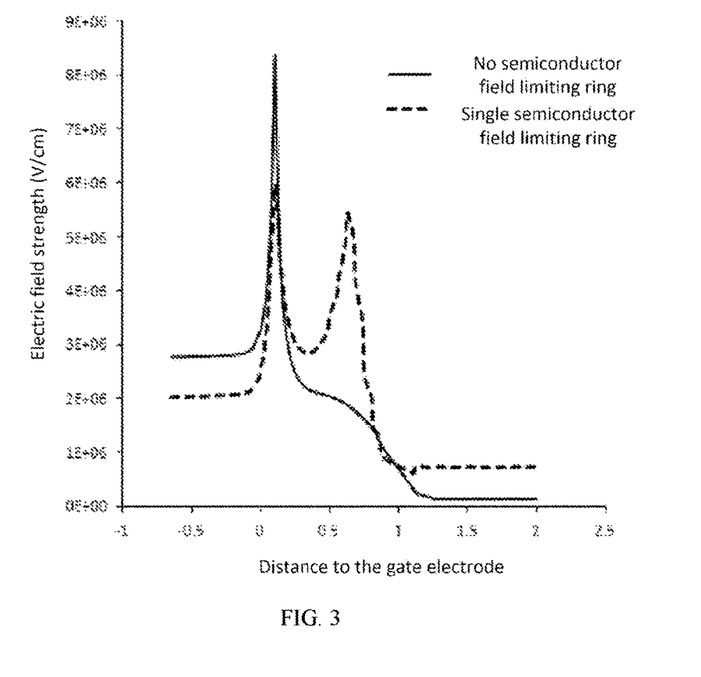
FIG. 3 is a schematic diagram of change in channel field on the basis of location when the high electron mobility transistor according to the first embodiment of the present invention is in the OFF state.

FIG. 3 is a schematic diagram of change in channel field on the basis of location, when the high electron mobility transistor according to the first embodiment of the present invention is in the OFF state. Referring to FIG. 3, the solid line in the figure is a schematic diagram of change in channel field on the basis of location, when the HEMT is in the OFF state, if no semiconductor field ring is provided; and the dotted line is a schematic diagram of change in channel field on the basis of location, when the HEMT is in the OFF state, if a single semiconductor field ring according to the first embodiment of the present invention is provided. The voltage between the source electrode and the drain electrode of the HEMT is 200 V, and the voltage of the gate electrode is −6 V. It can be seen from FIG. 3 that the use of the semiconductor field ring can significantly decrease the peak value of the electric field strength at an end of the gate electrode close to the drain electrode (when the corresponding horizontal coordinate is 0), and the breakdown voltage of the HEMT device is thus increased.

Hereinafter, a method for preparing the high electron mobility transistor according to the embodiments of the present invention will be described.

First, a channel layer 12 and a barrier layer 13 are successively formed on a substrate 11. The channel layer 12 is made of GaN, the barrier layer 13 is made of AlGaN, and the channel layer 12 and the barrier layer 13 form a heterojunction structure with 2DEG being formed at the heterogeneous interface. Then, a semiconductor field limiting layer is formed on the barrier layer 13. The semiconductor field limiting layer is made of AlGaN, and a content of Al element in the AlGaN semiconductor field limiting layer is less than a content of Al element in the AlGaN barrier layer 13. A mask is formed by a photolithography process, and the excess part is removed by etching to form the AlGaN semiconductor field ring 17. Finally, on the barrier layer 13, a source electrode 14 and a drain electrode 15 are formed on two sides of the AlGaN semiconductor field ring 17, respectively. A schottky gate electrode is formed on the barrier layer 13 between the source electrode 14 and the AlGaN semiconductor field ring 17. The source electrode 14 and the drain electrode 15 may be formed by high-temperature annealing, or heavy doping, or ion implantation or the like.

Preferably, the high electron mobility transistor may further comprise a nucleation layer 18 and a buffer layer 19 successively located between the substrate 11 and the channel layer 12. The nucleation layer 18 may be made of AlN or GaN. The nucleation layer 18 has an effect on parameters of the heterojunction material formed by the channel layer 12 and the barrier layer 13 located on the nucleation layer 18 such as crystalline quality, surface topography and electrical properties, and has a function of matching the material of the substrate and the semiconductor material in the heterojunction structure. The buffer layer 19 is located between the nucleation layer 18 and the channel layer 12, and may be made of AlGaN or GaN or the like. The buffer layer can optimize parameters of the material which is located on the buffer layer for forming the channel layer 12 and the barrier layer 13, such as crystalline quality, surface topography and electrical properties, etc.

Preferably, the high electron mobility transistor may further comprise a passivation layer (not shown in FIG. 1) located on surfaces of the source electrode, the drain electrode, the schottky gate electrode, the at least one semiconductor field ring and the barrier layer. The passivation layer is preferably made of any one of SiN, $SiO_2$, AlN and $Al_2O_3$ or any combination thereof.

Preferably, the channel layer is made of GaN, the barrier layer 13 is made of InAlN, and the semiconductor field ring 17 is made of InAlN having homogeneous components. When the semiconductor field ring 17 is made of InAlN having homogeneous components, the principle of improving the voltage withstanding level of the HEMT device by the semiconductor field ring 17 is the same as the principle of improving the voltage withstanding level of the HEMT device by the assumption that the semiconductor field ring 17 is made of AlGaN and the barrier layer 13 is made of AlGaN. The preparation method is similar and will not be repeated herein.

Preferably, when the barrier layer is made of AlGaN or InAlN, the semiconductor field ring may be made of n-type GaN or p-type GaN. Since there is a greater difference between the lattice constant of the n-type GaN and the lattice constant of the barrier layer, the piezoelectric effect between them is more significant when compared to the use of AlGaN or InGaN, and the depletion of the 2DEG below them is more remarkable. Since there are ionized acceptor negative charges and also negative charges generated by the piezoelectric effect in the p-type GaN, the resulting electric field is much bigger than an electric field generated by a semiconductor field ring made of n-type GaN. Therefore, much 2DEG can be depleted, and the electric field strength at the edge of the gate electrode can be adjusted within a larger range.

Preferably, the content of a first metal element (for example, Al element) in the semiconductor field ring 17 gradually changes, for example, decreases from the interface where the semiconductor field ring 17 contacts with the barrier layer 13 to the surface of the semiconductor field ring (a side of the semiconductor field ring 17 away from the barrier layer 13).

Specifically, the channel layer is made of GaN, the barrier layer is made of AlGaN, and the semiconductor field ring 17 is made of AlGaN having gradually-changed components. From the interface where the AlGaN semiconductor field ring 17 contacts with the AlGaN barrier layer 13 to the surface of the AlGaN semiconductor field ring (a side away from the barrier layer 13), the content of Al element in the AlGaN semiconductor field ring 17 gradually decreases, and the content of Ga element gradually increases. Moreover, for example, the content of Al element in the AlGaN barrier layer 13 is greater than the maximum content of Al element in the AlGaN semiconductor field ring 17.

Since the AlN material has a lattice constant less than that of the GaN material, the AlGaN material will have a greater lattice constant if the content of Al element in the AlGaN material is lower. Since the content of Al element in the AlGaN semiconductor field ring 17 gradually decreases from the interface where the AlGaN semiconductor field ring 17 contacts with the AlGaN barrier layer 13 to the surface of the AlGaN semiconductor field ring (a side away from the barrier layer 13), the lattice constant of the AlGaN semiconductor field ring 17 gradually increases from the interface where the AlGaN semiconductor field ring 17 contacts with the AlGaN barrier layer 13 to the surface of the AlGaN semiconductor field ring 17 (a side away from the barrier layer 13). Such gradient change in the lattice constant introduces, step-by-step, a compressive strain into the whole AlGaN semiconductor field ring 17 in the horizontal direction. Since AlGaN has a very large piezoelectric polarization constant, the resulting polarization field is very large. Accordingly, piezoelectric negative charges are not only formed on a surface where the AlGaN semiconductor field ring 17 contacts with the AlGaN barrier layer 13, and negative charges are also distributed within the whole AlGaN semiconductor field ring 17. Compared with semiconductor field rings having same components in each layer, the content of the metal element in this structure gradually changes from the interface where the semiconductor field ring contacts with the barrier layer to the surface of the semiconductor field ring, so that the density of piezoelectric charges of the semiconductor field ring structure becomes higher and a stronger piezoelectric polarization field can be generated. Thus, under a same thickness, the AlGaN field ring 17 depletes much 2DEG. When the HEMT is cut off, the density of the electric field lines at the edge of the schottky gate electrode 16 can be further decreased, so that the electric field peak here can be further decreased. Thus, the HEMT can withstand a higher voltage.

Specifically, when the barrier layer 13 is made of InAlN and the semiconductor field ring 17 is made of InAlN having gradually-changed components, the content of In element in the InAlN semiconductor field ring 17 gradually increases from the interface where the semiconductor field ring 17 contacts with the barrier layer 13 to the surface of the semiconductor field ring 17 (a side away from the barrier layer 13), and the content of Al element gradually decreases. In other words, the content of Al element in the InAlN barrier layer 13 is greater than the maximum content of Al element in the InAlN semiconductor field ring 17. When both the semiconductor field ring 17 and the barrier layer 13 are made of InAlN, the semiconductor field ring 17 can improve the voltage withstanding level of the HEMT device. The principle is the same as the principle of improving the voltage withstanding level of the HEMT device by the assumption where both the semiconductor field ring 17 and the barrier layer 13 are made of AlGaN and the content of Al element in the AlGaN semiconductor field ring 17 gradually decreases from the interface where the semiconductor field ring 17 contacts with the barrier layer 13 to the surface of the semiconductor field ring 17 (a side away from the barrier layer 13). The preparation method is similar and will not be repeated herein.

Figure 4:
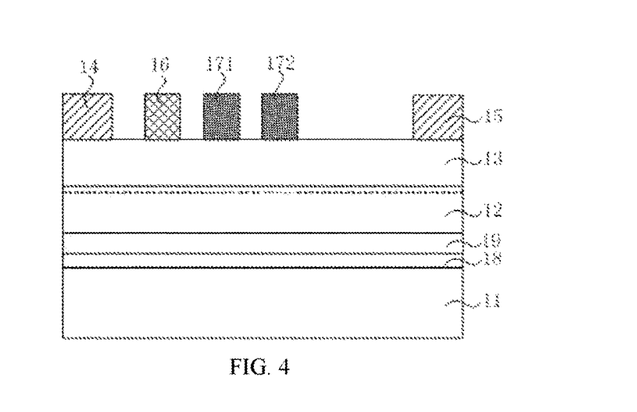
FIG. 4 is a structure diagram of a high electron mobility transistor according to a second embodiment of the present invention.

FIG. 4 is a structure diagram of a high electron mobility transistor according to the second embodiment of the present invention. Referring to FIG. 4, the high electron mobility transistor comprises: a substrate 11; a nucleation layer 18 located on the substrate 11; a buffer layer 19 located on the nucleation layer 18; a channel layer 12 located on the buffer layer 19; a barrier layer 13 located on the channel layer 12; a source electrode 14, a drain electrode 15, and a schottky gate electrode 16 located between the source electrode 14 and the drain electrode 15, all located on the barrier layer 13; and at least two semiconductor field rings located on the barrier layer 13 and between the schottky gate electrode 16 and the drain electrode 15.

The second embodiment is based on the first embodiment, but has a difference from the first embodiment that the high electron mobility transistor provided in the second embodiment comprises at least two semiconductor field rings located on the barrier layer 13 and between the schottky gate electrode 16 and the drain electrode 15. In this embodiment, the description is given by taking a first semiconductor field ring 171 and a second semiconductor field ring 172 as example.

Each of the first semiconductor field ring 171 and the second semiconductor field ring 172 is made of homogeneous components, or the content of a metal element in each of the first semiconductor field ring 171 and the second semiconductor field ring 172 gradually changes from the interface where the respective semiconductor field ring contacts with the barrier layer 13 to a surface of the respective semiconductor field ring away from the barrier layer 13.

All the channel layer 12, the barrier layer 13 and the semiconductor field rings 171 and 172 are made of III-V compound semiconductor material. Preferably, the channel layer 12 is made of GaN, the barrier layer 13 is made of AlGaN, and the first semiconductor field ring 171 and the second semiconductor field ring 172 can be made of any one of AlGaN having homogeneous components, AlGaN having gradually-changed components, n-type GaN and p-type GaN. Alternatively, the channel layer 12 is made of GaN, the barrier layer 13 is made of InAlN, and the first semiconductor field ring 171 and the second semiconductor field ring 172 can be made of any one of InAlN having homogeneous components, InAlN having gradually-changed components, n-type GaN and p-type GaN.

Specifically, for example, when the first semiconductor field ring 171 and the second semiconductor field ring 172 are made of AlGaN having gradually-changed components, from the interface where the semiconductor field rings contact with the barrier layer 13 to the surfaces of the first semiconductor field ring 171 and the second semiconductor field ring 172 (a side away from the barrier layer 13), the content of Al element in the first semiconductor field ring 171 and the second semiconductor field ring 172 gradually decreases, and the content of Ga element gradually increases. For example, the content of Al element in the AlGaN barrier layer 13 is greater than that of Al element in the first AlGaN semiconductor field ring 171 and the second AlGaN semiconductor field ring 172. For example, when the first semiconductor field ring 171 and the second semiconductor field ring 172 are made of InAlN, from the interface where the first semiconductor field ring 171 and the second semiconductor field ring 172 contact with the barrier layer 13 to the surfaces of the first semiconductor field ring 171 and the second semiconductor field ring 172 (a side away from the barrier layer 13), the content of In element in the first semiconductor field ring 171 and the second semiconductor field ring 172 gradually increases, and the content of Al element gradually decreases. For example, the content of Al element in the InAlN barrier layer 13 is greater than the maximum content of Al element in the first InAlN semiconductor field ring 171 and the second InAlN semiconductor field ring 172.

For example, by setting the locations of the first semiconductor field ring 171 and the second semiconductor field ring 172, the breakdown voltage of the semiconductor device can be further increased. For example, a distance from the first semiconductor field ring 171 to the schottky gate electrode 16 is greater than a distance from the first semiconductor field ring 171 to the drain electrode 15. Since the peak of the electric field strength occurs in the vicinity of the schottky gate electrode 16, by arranging the first semiconductor field ring 171 in the vicinity of the schottky gate electrode 16, the two-dimensional electron gas below the first semiconductor field ring 171 can be consumed to a large extent. In addition, by arranging the second semiconductor field ring 172 close to the drain electrode 15 and allowing the distance from the second semiconductor field ring 172 to the drain electrode 15 to be less than the distance from the first semiconductor field ring 171 to the schottky gate electrode 16, electric field lines can be distributed more uniformly, and the breakdown voltage of the HEMT device is further increased.

A method for preparing the semiconductor field rings according to the second embodiment of the present invention is similar to the method for preparing the semiconductor field ring according to the first embodiment in which a mask layer is formed by a photolithography process and at least two semiconductor field rings are then formed by etching on the barrier layer.

Compared with the single semiconductor field ring in the HEMT provided in the first embodiment, the at least two semiconductor field rings provided in the second embodiment can eliminate the electric field peak introduced by the previous semiconductor field ring at its edge close to the drain electrode, and the voltage withstanding level of the HEMT device is further improved. On the other hand, by adjusting the distance between the at least two semiconductor field rings, the electric field strength withstood by each semiconductor field ring during the operation can be the same, and the electric field in the barrier layer between the schottky gate electrode and the drain electrode tends to be uniform, so that the voltage withstanding level of the HEMT device is further improved.

Figure 5:
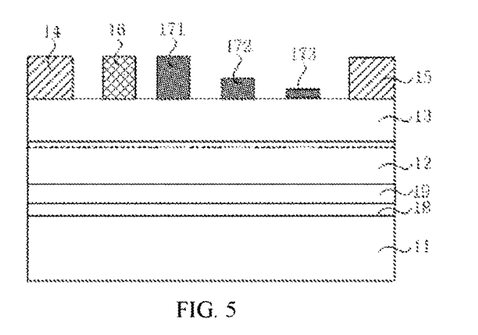
FIG. 5 is a structure diagram of a high electron mobility transistor according to a third embodiment of the present invention.

FIG. 5 is a structure diagram of a high electron mobility transistor according to the third embodiment of the present invention. Referring to FIG. 5, the high electron mobility transistor comprises: a substrate 11; a nucleation layer 18 located on the substrate 11; a buffer layer 19 located on the nucleation layer 18; a channel layer 12 located on the buffer layer 19; a barrier layer 13 located on the channel layer 12; a source electrode 14, a drain electrode 15, and a schottky gate electrode 16 located between the source electrode 14 and the drain electrode 15, all located on the barrier layer 13; and at least two semiconductor field rings located on the barrier layer 13 and between the schottky gate electrode 16 and the drain electrode 15. For example, the at least two semiconductor field rings are made of homogeneous components. For example, the thickness of each of the at least two semiconductor field rings gradually decreases from where close to the schottky gate electrode 16 to where close to the drain electrode 15.

In this embodiment, the present invention will be described by taking a first semiconductor field ring 171, a second semiconductor field ring 172 and a third semiconductor field ring 173 as example.

All the channel layer 12, the barrier layer 13 and the semiconductor field rings 171, 172 and 173 are made of III-V compound semiconductor material. Preferably, the first semiconductor field ring 171, the second semiconductor field ring 172 and the third semiconductor field ring 173 can be made of AlGaN, n-type GaN or p-type GaN, and the barrier layer 13 is also made of AlGaN. When both the barrier layer 13 and the field rings 171, 172 and 173 are made of AlGaN, the content of Al element in the field rings 171, 172 and 173 is less than that of Al element in the barrier layer 13. Alternatively, the first semiconductor field ring 171, the second semiconductor field ring 172 and the third semiconductor field ring 173 are made of any one of InAlN, n-type GaN and p-type GaN, and the barrier layer 13 is made of InAlN. When both the barrier layer 13 and the field rings 171, 172 and 173 are made of InAlN, the content of Al element in the field rings 171, 172 and 173 is less than that of Al element in the barrier layer 13.

In this embodiment, the thickness of each of the first semiconductor field ring 171, the second semiconductor field ring 172 and the third semiconductor field ring 173 gradually decreases from where close to the schottky gate electrode 16 to where close to the drain electrode 15. For example, a plurality of semiconductor field rings can also be arranged between the schottky gate electrode 16 and the drain electrode 15, and the thickness of the plurality of semiconductor field rings can gradually decrease from where close to the schottky gate electrode 16 to where close to the drain electrode 15. Moreover, by adjusting the electric field strength between the schottky gate electrode 16 and the drain electrode 15, the critical breakdown electric field strength is simultaneously reached at the edges of the semiconductor field rings close to the drain electrode 15, and the breakdown voltage of the HEMT device can be increased to a large extent without obviously increasing the channel resistance. For example, one semiconductor field ring 171 can also be arranged between the schottky gate electrode 16 and the drain electrode 15, and the thickness of the semiconductor field ring 171 gradually decreases from a side close to the schottky gate electrode 16 to a side close to the drain electrode 15. For example, the side of the semiconductor field ring 171 away from the barrier layer 13 is in a slope shape having an angle of inclination, for example, from 30 degrees to 45 degrees. Thus, by eliminating the electric field peak at an edge of the gate electrode 16 by a side of the semiconductor field ring 171 close to the gate electrode 16 and meanwhile forming a slope on a side of the semiconductor field ring 171 away from the barrier layer 13, the possibility of generating an electric field peak at an edge of the semiconductor field ring 171 close to the drain electrode 15 is further eliminated, and the breakdown voltage of the HEMT device is further increased.

With the gradual decrease in the thickness of the semiconductor field rings, the amount of piezoelectric negative charges in each semiconductor field ring also decreases, and the resulting polarization field also becomes weaker. Accordingly, the depletion of the two-dimensional electron gas is also reduced. For the HEMT device, the electric field strength is highest at the edge of the schottky gate electrode 16 and gradually decreases towards the drain electrode. Thus, the reduction of the electric field strength is not highly required at a place close to the drain electrode 15. Therefore, at least two semiconductor field rings are formed as a structure having a gradually-decreased thickness in a direction from the schottky gate electrode 16 to the drain electrode 15, and the 2DEG can be depleted to different degrees from the schottky gate electrode 16 to the drain electrode 15. Moreover, the electric field in the barrier layer 13 is adjusted to different degrees by the at least two semiconductor field rings, so that the reduction of the electric field peak at the edge of the schottky gate electrode 16 is maximized, and the reduction level of the electric field from the schottky gate electrode 16 to the drain electrode 15 gradually decreases, so that the approximately constant electric field strength between source electrode 14 and the drain electrode 15 is maintained. Compared with the second embodiment, in this embodiment, the low on-resistance is maintained while adjusting the electric field between the schottky gate electrode and the drain electrode and increasing the breakdown voltage of the HEMT. Moreover, the power consumption of the device becomes lower, and this embodiment is more applicable to high-voltage and high-frequency HEMTs. A method for preparing field rings in this embodiment is similar to that in the first embodiment, and the field rings with different thickness are realized by forming a mask layer through multiple times of photolithography processes and successive etching.

Figure 6:
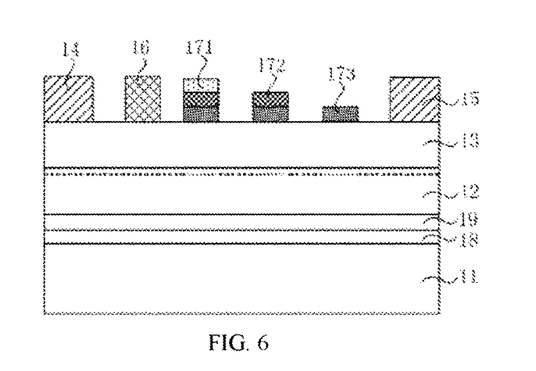
FIG. 6 is a structure diagram of a high electron mobility transistor according to a fourth embodiment of the present invention.

FIG. 6 is a structure diagram of a high electron transistor according to the fourth embodiment of the present invention. Referring to FIG. 6, the high electron mobility transistor comprises: a substrate 11; a nucleation layer 18 located on the substrate 11; a buffer layer 19 located on the nucleation layer 18; a channel layer 12 located on the buffer layer 19; a barrier layer 13 located on the channel layer 12; a source electrode 14, a drain electrode 15, and a schottky gate electrode 16 located between the source electrode 14 and the drain electrode 15, all located on the barrier layer 13; and at least two semiconductor field rings located on the barrier layer 13 and between the schottky gate electrode 16 and the drain electrode 15. The at least two semiconductor field rings above have a number of layers according to their component contents. The content of a metal element in the at least two semiconductor field rings may gradually changes from the interface where the semiconductor field rings contact with the barrier layer 13 to the surfaces of the semiconductor field rings. The at least two semiconductor field rings have a thickness gradually decreased by omitting the topmost layer from where close to the schottky gate electrode 16 to where close to the drain electrode 15, so that a stepped field ring structure is formed. It is to be noted that the semiconductor limiting ring closest to the drain electrode 15 can have only one layer. In this case, one layer can be gradually added to a plurality of semiconductor field rings in a direction from this semiconductor limiting ring to the gate electrode 16, so that the stepped field ring structure as above is formed. In a case where the HEMT device comprises two semiconductor field rings, the semiconductor field ring close to the gate electrode 16 has two layers, and the field ring on a side close to the drain electrode 15 can have one layer. Those skilled in the art can conduct similar analogy. Similarly, it should be understood that the thickness of each layer of a same semiconductor field ring can be same or different, and the thickness of each layer of different semiconductor field rings can also be same or different.

In this embodiment, the present invention will be described by taking a first semiconductor field ring 171, a second semiconductor field ring 172 and a third semiconductor field ring 173 as examples.

All the channel layer 12, the barrier layer 13 and the semiconductor field rings 171, 172 and 173 are made of III-V compound semiconductor material. Preferably, the channel layer is made of GaN, the barrier layer 13 is made of AlGaN, and the first semiconductor field ring 171, the second semiconductor field ring 172 and the third semiconductor field ring 173 can be made of AlGaN. Alternatively, the channel layer is made of GaN, the barrier layer 13 is made of InAlN, and the first semiconductor field ring 171, the second semiconductor field ring 172 and the third semiconductor field ring 173 are made of InAlN.

When all the first semiconductor field ring 171, the second semiconductor field ring 172, the third semiconductor field ring 173 and the barrier layer 13 are made of AlGaN, from the interface where the first semiconductor field ring 171, the second semiconductor field ring 172 and the third semiconductor field ring 173 contact with the barrier layer 13 to the surfaces of the first semiconductor field ring 171, the second semiconductor field ring 172 and the third semiconductor field ring 173 (a side away from the barrier layer 13), the content of Al element gradually decreases, and the content of Ga element gradually increases. The content of Al element in the AlGaN barrier layer 13 is greater than that of Al element in the first AlGaN semiconductor field ring 171, the second AlGaN semiconductor field ring 172 and the third AlGaN semiconductor field ring 173. When all the first semiconductor field ring 171, the second semiconductor field ring 172, the third semiconductor field ring 173 and the barrier layer 13 are made of InAlN, from the interface where the first semiconductor field ring 171, the second semiconductor field ring 172 and the third semiconductor field ring 173 contact with the barrier layer 13 to the surfaces of the first semiconductor field ring 171, the second semiconductor field ring 172 and the third semiconductor field ring 173 (a side away from the barrier layer 13), the content of In element in the three semiconductor field rings gradually increases, and the content of Al element gradually decreases. The content of Al element in the InAlN barrier layer 13 is greater than the maximum content of Al element in the first AlGaN semiconductor field ring 171, the second AlGaN semiconductor field ring 172 and the third AlGaN semiconductor field ring 173.

By taking all the first semiconductor field ring 171, the second semiconductor field ring 172, the third semiconductor field ring 173 and the barrier layer 13 being made of AlGaN as example, the first semiconductor field ring 171 has three layers according to the content of Al element, the second semiconductor field ring 172 has two layers according to the content of Al element and the third semiconductor field ring 173 has one layer according to the content of Al. Referring to FIG. 6, the barrier layer 13 is made of $Al_{0.4}Ga_{0.6}N$. Starting from the schottky gate electrode 16, from the interface where the first semiconductor field ring 171 contacts with the barrier layer 13 to a surface of the first semiconductor field ring 171 (a side away from the barrier layer 13), the content of the metal element in each layer of the first semiconductor field ring 171 is $Al_{0.3}Ga_{0.7}N$, $Al_{0.2}Ga_{0.8}N$ and $Al_{0.1}Ga_{0.9}N$, respectively; from the interface where the second semiconductor field ring 172 contacts with the barrier layer 13 to a surface of the second semiconductor field ring 172 (a side away from the barrier layer 13), the content of the metal element in each layer of the second semiconductor field ring 172 is $Al_{0.3}Ga_{0.7}N$ and $Al_{0.2}Ga_{0.8}N$, respectively; and, from the interface where the third semiconductor field ring 173 contacts with the barrier layer 13 to a surface of the third semiconductor field ring 173 (a side away from the barrier layer 13), the content of the metal element in the third semiconductor field ring 173 is $Al_{0.3}Ga_{0.7}N$. Since the uppermost layer of each semiconductor field ring is omitted with respect to the previous semiconductor field ring, the thickness of the semiconductor field rings gradually decreases from where close to the schottky gate electrode 16 to where close to the drain electrode 15.

The first semiconductor field ring 171 close to the schottky gate electrode 16 consists of three layers of AlGaN having different components. Since a strain exists between the AlGaN layers having different components, piezoelectric negative charges are introduced into the whole first semiconductor field ring 171. Moreover, since the first semiconductor field ring 171 has a largest thickness, its capability of depleting the 2DEG is the highest among the three field rings. Thus, the electric field peak at the edge of the gate electrode can be decreased significantly. The thickness of the third semiconductor field ring 173 close to the drain electrode 15 is relatively small, and the concentration of piezoelectric negative charges in the vicinity of the third semiconductor field ring 173 is relatively low. Considering that the electric field strength is low here, the electric field between the schottky gate electrode 16 and the drain electrode 15 can still be adjusted by using semiconductor field rings having a small thickness. Therefore, the breakdown voltage of the HEMT is increased while the low on-resistance is maintained. Moreover, the power consumption of the device becomes lower, and this embodiment is more applicable to high-voltage and high-frequency HEMTs.

FIGS. 7A-7F are sectional views corresponding to steps of a method for preparing the high electron mobility transistor according to the fourth embodiment of the present invention. Hereinafter, the method for preparing the high electron mobility transistor according to according to the embodiment of the present invention will be described with reference to FIGS. 7A-7F.

Figure 7A:
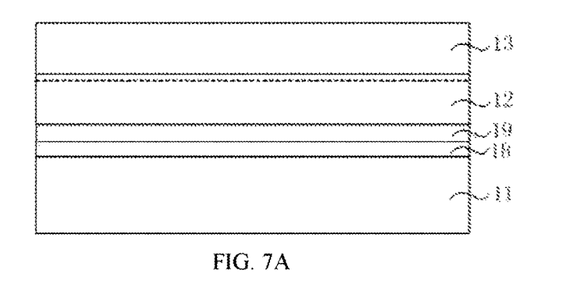
FIGS. 7A-7F are sectional views corresponding to steps of a method for preparing the high electron mobility transistor according to a fourth embodiment of the present invention.

Referring to FIG. 7A, first, a nucleation layer 18, a buffer layer 19, a channel layer 12 and a barrier layer 13 are sequentially formed on a substrate 11.

The channel layer 12 is made of GaN, the barrier layer 13 is made of $Al_{0.4}Ga_{0.6}N$, and the channel layer 12 and the barrier layer 13 form a heterojunction structure with 2DEG being formed at the heterogeneous interface.

Figure 7B:
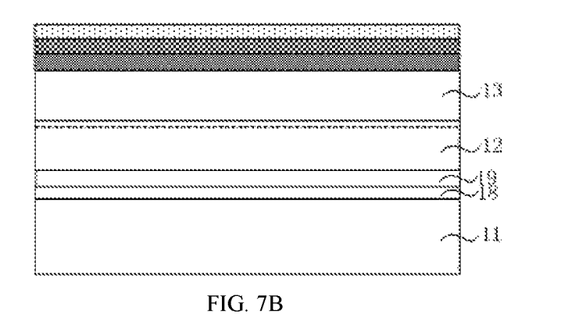

Referring to FIG. 7B, a semiconductor field ring layer of a three-layered structure is formed on the barrier layer 13. The contents of the metal element of each layer included in the semiconductor field ring layer from the interface where the semiconductor field ring layer contact with the barrier layer 13 to the top layer are $Al_{0.3}Ga_{0.7}N$, $Al_{0.2}Ga_{0.8}N$ and $Al_{0.1}Ga_{0.9}N$, respectively.

Figure 7C:
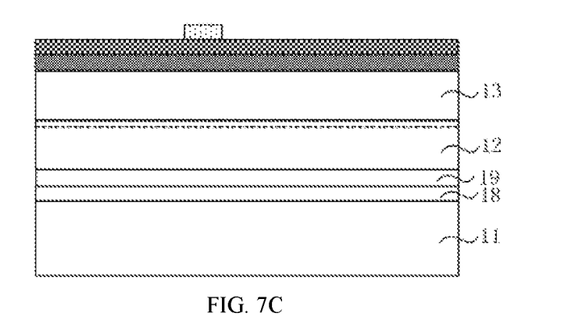

Referring to FIG. 7C, a mask layer is formed on the semiconductor field ring layer by a photolithography process, only a hierarchical structure $Al_{0.1}Ga_{0.9}N$ of the first semiconductor field ring layer close to the schottky gate electrode is reserved by etching, and the $Al_{0.1}Ga_{0.9}N$ semiconductor field ring layer on two sides of the hierarchical structure of the first semiconductor field ring layer are removed to expose $Al_{0.2}Ga_{0.8}N$ semiconductor field ring layer below the $Al_{0.1}Ga_{0.9}N$ semiconductor field ring.

Figure 7D:
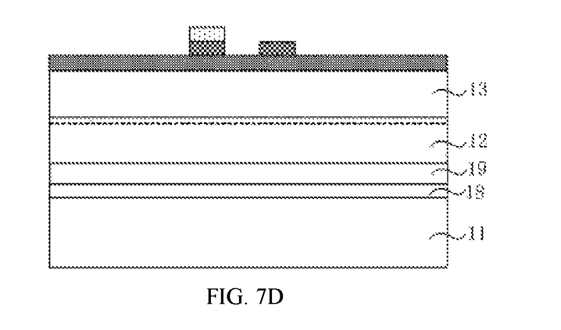

Referring to FIG. 7D, a mask layer is formed by photolithographing the exposed $Al_{0.2}Ga_{0.8}N$ semiconductor field ring layer close to the hierarchical structure $Al_{0.1}Ga_{0.9}N$, the exposed $Al_{0.2}Ga_{0.8}N$ semiconductor field ring layer is etched to form an $Al_{0.2}Ga_{0.8}N$ hierarchical structure located below the hierarchical structure $Al_{0.1}Ga_{0.9}N$ of the first semiconductor field ring 171 and an $Al_{0.2}Ga_{0.8}N$ hierarchical structure of the second semiconductor field ring 172 on a side of the hierarchical structure $Al_{0.1}Ga_{0.9}N$ of the first semiconductor field ring 171, and an $Al_{0.3}Ga_{0.7}N$ semiconductor field ring layer below the $Al_{0.2}Ga_{0.8}N$ semiconductor field ring layer is exposed.

Figure 7E:
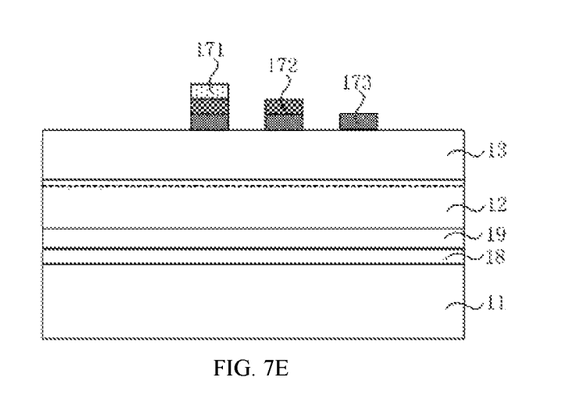

Referring to FIG. 7E, a mask layer is formed by photolithographing the exposed $Al_{0.3}Ga_{0.7}N$ semiconductor field ring layer close to the $Al_{0.2}Ga_{0.8}N$ hierarchical structure of the second semiconductor field ring 172, the exposed $Al_{0.3}Ga_{0.7}N$ semiconductor field ring layer is etched to form an $Al_{0.3}Ga_{0.7}N$ hierarchical structure located below the hierarchical structure $Al_{0.1}Ga_{0.9}N$ of the first semiconductor field ring 171 and the $Al_{0.2}Ga_{0.8}N$ hierarchical structure of the first semiconductor field ring 171, an $Al_{0.3}Ga_{0.7}N$ hierarchical structure located below the $Al_{0.2}Ga_{0.8}N$ hierarchical structure of the second semiconductor field ring 172, and an $Al_{0.3}Ga_{0.7}N$ hierarchical structure of the third semiconductor field ring 173.

Since two adjacent materials have a different etching selectivity due to different contents of Al element in layers of the field rings, the height of each field ring can be accurately controlled technically and the performance uniformity of the device can be maintained. A $BCl_3/SF_6$ dry-etching process can be used for the field rings of such a structure, and the mixture of $SF_6$ and $BCl_3$ increases the number of Cl free radicals of an etching agent and F atoms of an inhibitor, allowing the etching rate of AlGaN with different contents of Al element to be different. The etching rate of AlGaN with a high content of Al element is slow during the $BCl_3/SF_6$ mixed etching, because nonvolatile $AlF_3$ is formed on the surface of AlGaN so that the etching rate of Cl is decreased. When the content of Al is higher, much AlF$_3$ is formed, and the corresponding etching rate is slower. AlF$_3$ can be eliminated by subsequent plasma sputtering.

Figure 7F:
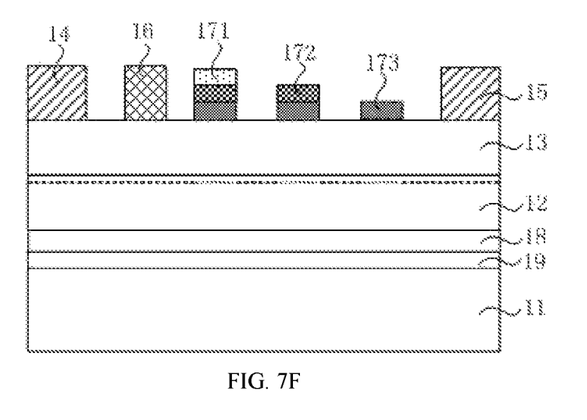

Referring to FIG. 7F, a source electrode 14 and a drain electrode 15 are formed on two sides of the first semiconductor field ring 171, the second semiconductor field ring 172 and the third semiconductor field ring 173 on the barrier layer 13, and a schottky gate electrode 16 is formed on the barrier 13 and between the source electrode 14 and the first semiconductor field ring 171.

In this embodiment, since two contacted AlGaN materials with different contents of metal elements have different etching selectivities due to different contents of Al element in layers of each semiconductor field ring, the height of each semiconductor field ring can be accurately controlled technically and the performance uniformity of the HEMT device can be maintained.

The foregoing descriptions are merely preferred embodiments of the present invention and not intended to limit the present invention. For those skilled in the art, various alterations and variations can be made to the present invention. Various embodiments of the present invention can be combined with each other if not conflict logically. Any modifications, equivalent replacements and improvements made within the spirit and principle of the present invention shall fall into the protection scope of the present invention.

What is claimed is:

1. A high electron mobility transistor, comprising: a substrate;
    a channel layer located on the substrate; a barrier layer located on the channel layer;
    a source electrode, a drain electrode, and a schottky gate electrode located between the source electrode and the drain electrode, all located on the barrier layer; and
    at least one semiconductor field ring located on the barrier layer and between the schottky gate electrode and the drain electrode;
    wherein the at least one semiconductor field ring has a lattice constant greater than that of the barrier layer; and
    wherein the at least two semiconductor field rings comprise a first semiconductor field ring close to the schottky gate electrode and a second semiconductor field ring close to the drain electrode, and a thickness of the first semiconductor field ring is greater than that of the second semiconductor field ring.

2. The high electron mobility transistor according to claim 1, wherein the at least one semiconductor field ring has a homogeneous structure.

3. The high electron mobility transistor according to claim 1, wherein the at least one semiconductor field ring contains a first metal element, and a content of the first metal element in the at least one semiconductor field ring decreases from an interface where the at least one semiconductor field ring contacts with the barrier layer to a side of the at least one semiconductor field ring away from the barrier layer.

4. The high electron mobility transistor according to claim 1, wherein the at least one semiconductor field ring comprises a first layer close to the barrier layer and a second layer away from the barrier layer in a direction perpendicular to the barrier layer, and a content of a metal element in the first layer is greater than that of a metal element in the second layer.

5. The high electron mobility transistor according to claim 1, wherein a distance of the at least one semiconductor field ring to the schottky gate electrode is less than that of the at least one semiconductor field ring to the drain electrode.

6. The high electron mobility transistor according to claim 1, wherein there are at least two semiconductor field rings.

7. The high electron mobility transistor according to claim 6, wherein a distance of at least one semiconductor field ring of the at least two semiconductor limiting rings to the schottky gate electrode is less than that of the at least one semiconductor field ring to the drain electrode.

8. The high electron mobility transistor according to claim 6, wherein one of the at least two semiconductor field rings close to the schottky gate electrode comprises at least two layers having different components in a direction perpendicular to the barrier layer, and the topmost layer of the at least two semiconductor field rings is gradually omitted in a direction from the schottky gate electrode to the drain electrode, so that a stepped structure in which a thickness of a plurality of semiconductor field rings is gradually decreased by one layer is formed.

9. The high electron mobility transistor according to claim 1, wherein the barrier layer and the at least one semiconductor field ring are made of III-V compound semiconductor material.

10. The high electron mobility transistor according to claim 9, wherein the channel layer is made of GaN, the barrier layer is made of AlGaN, and the at least one semiconductor field ring is made of any one of AlGaN, n-type GaN or p-type GaN.

11. The high electron mobility transistor according to claim 9, wherein the channel layer is made of GaN, the barrier layer is made of InAlN, and the at least one semiconductor field ring is made of any one of InAlN, n-type GaN or p-type GaN.

12. The high electron mobility transistor according to claim 9, wherein the at least one semiconductor field ring is made of AlGaN, and from an interface where the at least one semiconductor field ring contacts with the barrier layer to a side of the at least one semiconductor field ring away from the barrier layer, a content of Al element in the at least one semiconductor field ring gradually decreases, and a content of Ga element gradually increases.

13. The high electron mobility transistor according to claim 9, wherein the at least one semiconductor field ring is made of InAlN, and from an interface where the at least one semiconductor field ring contacts with the barrier layer to a side of the at least one semiconductor field ring away from the barrier layer, a content of Al element in the at least one semiconductor field ring gradually decreases, and a content of In element gradually increases.

14. The high electron mobility transistor according to claim 9, wherein both the barrier layer and the at least one semiconductor field ring are made of AlGaN, and a content of Al in the AlGaN barrier layer is greater than a maximum content of Al element in the at least one semiconductor field ring.

15. The high electron mobility transistor according to claim 9, wherein both the barrier layer and the at least one semiconductor field ring are made of InAlN, and a content of Al element in the InAlN barrier layer is greater than a maximum content of Al element in the at least one semiconductor field ring.

16. The high electron mobility transistor according to claim 1, further comprising a passivation layer located on surfaces of the source electrode, the drain electrode, the schottky gate electrode, the at least one semiconductor field ring and the barrier layer.

17. The high electron mobility transistor according to claim 16, wherein the passivation layer is made of any one of $SiO_2$, AlN and $Al_2O_3$ or combination thereof.

* * * * *